United States Patent
Leung et al.

(10) Patent No.: US 8,803,568 B2
(45) Date of Patent: Aug. 12, 2014

(54) DIVIDING A FREQUENCY BY 1.5 TO PRODUCE A QUADRATURE SIGNAL

(71) Applicant: QUALCOMM Incorporated, San Diego, CA (US)

(72) Inventors: Wingching Vincent Leung, San Diego, CA (US); Zixiang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/653,054

(22) Filed: Oct. 16, 2012

(65) Prior Publication Data

US 2013/0135016 A1  May 30, 2013

Related U.S. Application Data

(60) Provisional application No. 61/563,958, filed on Nov. 28, 2011.

(51) Int. Cl.
*H03B 19/06* (2006.01)

(52) U.S. Cl.
USPC ........... 327/118; 327/115; 327/117; 327/254; 327/255

(58) Field of Classification Search
USPC ......................................... 327/115, 117, 118
See application file for complete search history.

(56) References Cited

U.S. PATENT DOCUMENTS

| | | | |
|---|---|---|---|
| 6,570,946 B1 * | 5/2003 | Homol et al. | 375/371 |
| 6,882,229 B1 * | 4/2005 | Ho et al. | 331/1 A |
| 7,433,667 B2 | 10/2008 | Seippel et al. | |
| 2001/0048715 A1 | 12/2001 | Lee et al. | |
| 2003/0064699 A1 | 4/2003 | Olsen | |
| 2006/0217098 A1 | 9/2006 | Anderson et al. | |
| 2007/0160168 A1 | 7/2007 | Beukema et al. | |

OTHER PUBLICATIONS

International Search Report and Written Opinion—PCT/US2012/066902—ISA/EPO—Apr. 4, 2013.

* cited by examiner

*Primary Examiner* — John Poos
(74) *Attorney, Agent, or Firm* — William M. Hooks

(57) ABSTRACT

An apparatus for dividing a frequency by 1.5 to produce a quadrature signal is disclosed. The apparatus includes a divider that receives a differential input signal with a first frequency and two phases and creates a six-phase signal at a second frequency. The second frequency is the first frequency divided by 3. The apparatus also includes precision phase rotation circuitry that receives the six-phase signal and produces an eight-phase signal. The apparatus also includes a doubler that receives the eight-phase signal and produces a quadrature signal. The quadrature signal has a third frequency that is the first frequency divided by 1.5.

26 Claims, 10 Drawing Sheets

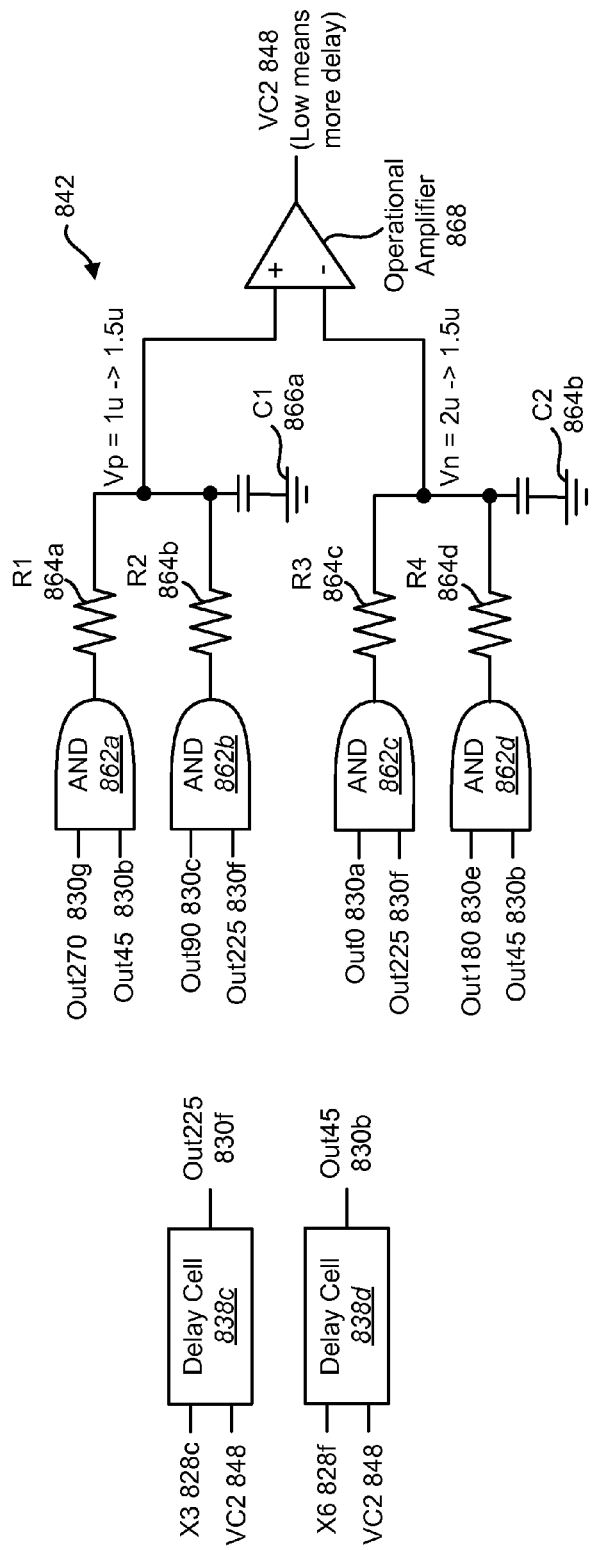
FIG. 8A
FIG. 8B

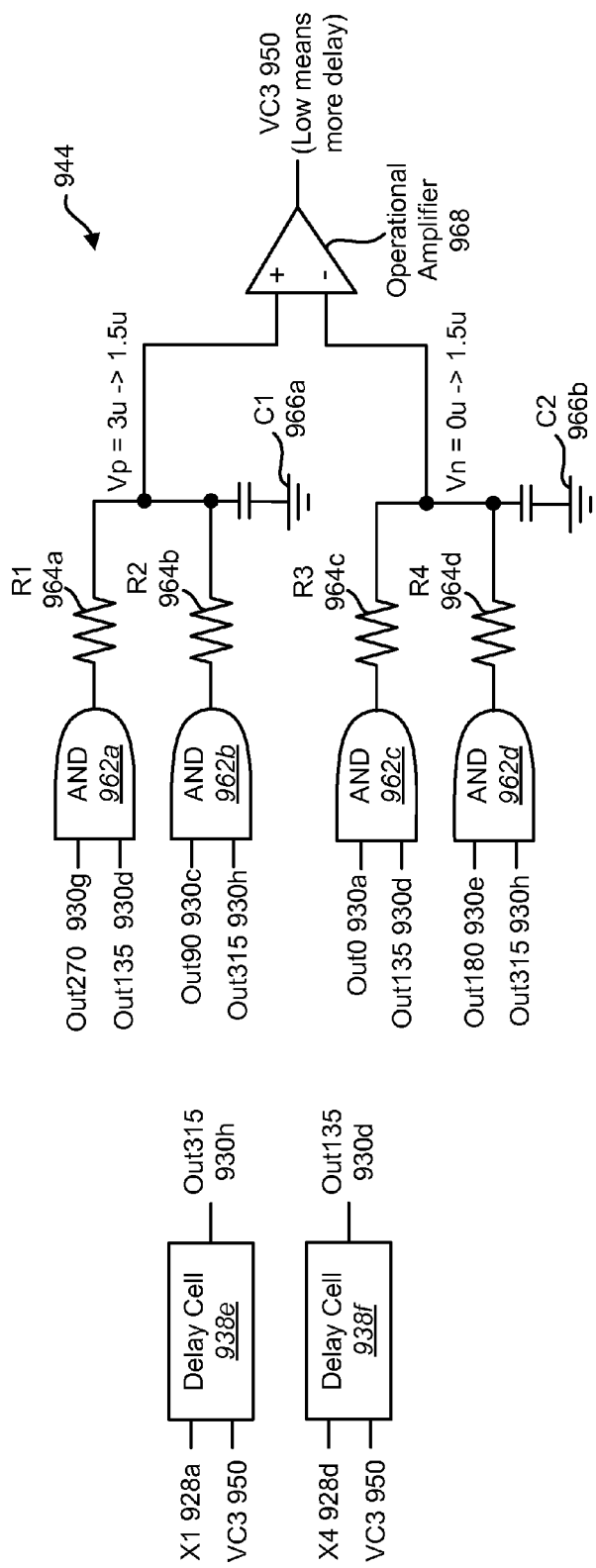
FIG. 9A
FIG. 9B

US 8,803,568 B2

DIVIDING A FREQUENCY BY 1.5 TO PRODUCE A QUADRATURE SIGNAL

CLAIM OF PRIORITY UNDER 35 U.S.C. §119

The present Application for Patent claims priority to Provisional Application No. 61/563,958, entitled "A novel divide-by-1.5 circuit" filed Nov. 28, 2011, and assigned to the assignee hereof and hereby expressly incorporated by reference herein.

TECHNICAL FIELD

The present disclosure relates generally to the field of frequency synthesis. More particularly, the disclosed configurations relate to dividing a frequency by 1.5 to produce a quadrature signal.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, benefits may be realized by dividing a frequency by 1.5 to produce a quadrature signal.

SUMMARY

An apparatus for dividing a frequency by 1.5 to produce a quadrature signal is disclosed. The apparatus includes a divider that receives a differential input signal with a first frequency and two phases and creates a six-phase signal at a second frequency. The second frequency is the first frequency divided by 3. The apparatus also includes precision phase rotation circuitry that receives the six-phase signal and produces an eight-phase signal. The apparatus also includes a doubler that receives the eight-phase signal and produces a quadrature signal. The quadrature signal has a third frequency that is the first frequency divided by 1.5.

The precision phase rotation circuitry may include one or more delay cells that each rotate one or more phases in the six-phase signal. Each delay cell may rotate one or more phases in the six-phase signal by 15 degrees, 30 degrees or 45 degrees. The amount of rotation performed may be based on a control signal to each delay cell. The control signal may be determined by a feedback loop. A control signal with a high value may produce less delay than a control signal with a low value. Each feedback loop may include one or more logical AND gates, resistors and capacitors. The resistors and capacitors may operate as a low pass filter for output of the logical AND gates.

The phase rotation circuitry may include six delay cells, each rotating a different phase in the six-phase signal. In one configuration, each delay cell includes a p-channel transistor, an n-channel transistor and an n-channel degeneration transistor in a series configuration. A control signal received at a gate of the degeneration transistor may determine an amount of delay for an input signal received at gates of the p-channel transistor and the n-channel transistor. The drains of the p-channel transistor and n-channel transistor may be coupled at an output of the delay cell. A source of the n-channel transistor may be coupled to a drain of the degeneration transistor. A source of the degeneration transistor may be coupled to ground. A source of the p-channel transistor may be coupled to a direct current reference voltage.

A method for dividing a frequency by 1.5 to produce a quadrature signal is also disclosed. A differential signal with a first frequency is received. A six-phase signal at a second frequency is created based on the differential signal where the second frequency is the first frequency divided by 3. The six-phase signal is converted to an eight-phase signal at the second frequency. The eight-phase signal is converted to a quadrature signal at a third frequency where the third frequency is the first frequency divided by 1.5.

An apparatus for dividing a frequency by 1.5 to produce a quadrature signal is also disclosed. The apparatus includes means for receiving a differential signal with a first frequency. The apparatus also includes means for creating a six-phase signal at a second frequency based on the differential signal where the second frequency is the first frequency divided by 3. The apparatus also includes means for converting the six-phase signal to an eight-phase signal at the second frequency. The apparatus also includes means for converting the eight-phase signal to a quadrature signal at a third frequency where the third frequency is the first frequency divided by 1.5.

A computer-program product for dividing a frequency by 1.5 to produce a quadrature signal is also disclosed. The computer-program product comprises a computer-readable medium having instructions thereon. The instructions include code for receiving a differential signal with a first frequency. The instructions also include code for creating a six-phase signal at a second frequency based on the differential signal where the second frequency is the first frequency divided by 3. The instructions also include code for converting the six-phase signal to an eight-phase signal at the second frequency. The instructions also include code for converting the eight-phase signal to a quadrature signal at a third frequency where the third frequency is the first frequency divided by 1.5.

BRIEF DESCRIPTION OF THE DRAWINGS

FIG. 8A is a circuit diagram illustrating operation of the second feedback loop;

FIG. 8B is a graphical illustration of phase rotation caused by the second feedback loop and delay cells;

FIG. 9A is a circuit diagram illustrating operation of the second feedback loop;

FIG. 9B is a graphical illustration of phase rotation caused by the third feedback loop and delay cells.

DETAILED DESCRIPTION

One possible way to divide a frequency by 1.5 is to use a doubler followed by a divider (divide-by-3) architecture. If a quadrature signal is desired, the divider may output a quadrature signal in such a configuration. However, this configuration may have problems. First, the divider may operate at a relatively high frequency (e.g., twice the clock frequency), which may introduce instability over process. Second, to obtain quadrature inputs for the doubler, clock signals may be high-pass/low-pass filtered by an RC/CR network (e.g., using buffers), which may result in relatively high power consumption and poor signal quality. For example, an RC/CR network may be used to produce a quadrature signal from a differential signal, e.g., the RC portion (a resistive-capacitive circuit implementing a low pass filter) may rotate a signal by +45 degrees and the CR portion (a capacitive-resistive circuit implementing a high pass filter) may rotate the same signal by −45 degrees. In addition to relatively poor power consumption, the RC/CR network may not be adaptive to broadband signals, among other performance restrictions.

Third, high-phase noise and imprecise phase relationships may result from the process-dependent high-pass/low-pass filtering. As used herein, the term "doubler" refers to a module that multiplies the frequency of a signal by approximately two. The term "divider" may refer to a module that divides the frequency of a signal, e.g., a "divide-by-3" module may be a divider with a divide ratio of three.

The present systems and methods may use a divider (e.g., divide-by-3) followed by a doubler. The divider may operate at a lower frequency (e.g., VCO frequency), which may provide more robust functionality over process. For quadrature phase generation, precision phase rotation circuitry and methods may be used, which may preserve the digital signal quality (for good phase noise and residue sideband performance) and reduce current consumption.

In an architecture with a divider followed by doublers (an I doubler and a Q doubler), the doublers may use eight phases (45 degrees apart) to generate four quadrature phases (90 degrees apart). However, a divider may only intrinsically generate six phases (60 degrees apart). Therefore, precision phase rotation may be used to generate the eight phases used by the doublers to produce four quadrature phases. Furthermore, the present systems and methods may be used to generate any fractional divide ratio, e.g., 2.5, 3.5, etc.

Figure 1:
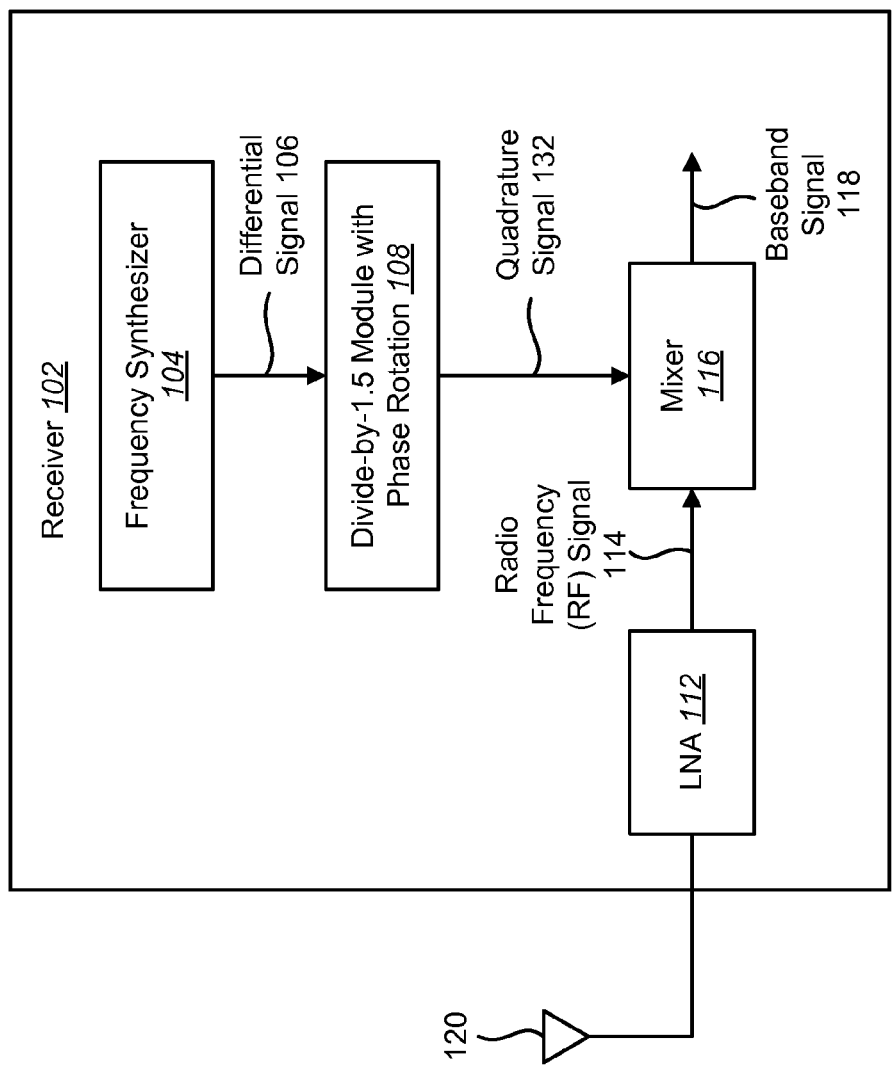
FIG. 1 is a block diagram illustrating a receiver.

FIG. 1 is a block diagram illustrating a receiver 102. The receiver 102 may be part of a mobile device or base station designed for wireless communication, e.g., part of a super high data rate (SHDR) receive local oscillator (LO) path. The receiver 102 may include, among other things, a low noise amplifier (LNA) 112, frequency synthesizer 104, a divide-by-1.5 module with phase rotation 108 and a mixer 116. The LNA 112 may receive a wireless communication signal from an antenna 120. The LNA 112 may amplify the received signal to usable levels and produce a radio frequency (RF) signal 114, i.e., a representation of the original signal sent. The frequency synthesizer 104 may output a differential signal 106 directed to a particular application. The frequency synthesizer 104 may be capable of producing different frequencies. The divide-by-1.5 module with phase rotation 108 may receive the differential signal 106 and output a quadrature signal 132. As discussed below, the divide-by-1.5 module with phase rotation 108 may use a divider followed by a doubler. Although illustrated in the receiver 102, the divide-by-1.5 module with phase rotation 108 may be used in various applications in a mobile device or base station designed for wireless communication. The mixer 116 may receive the RF signal 114 from the LNA 112 and the quadrature signal 132 from the divide-by-1.5 module with phase rotation 108 and produce a baseband signal 118. The baseband signal 118 may be the actual reconstructed audio received by a microphone on a transmitting device, e.g., voiced speech or other kinds of data. Thus, the receiver 102 may use the mixer 116 to reconstruct the baseband signal 118.

Figure 2:
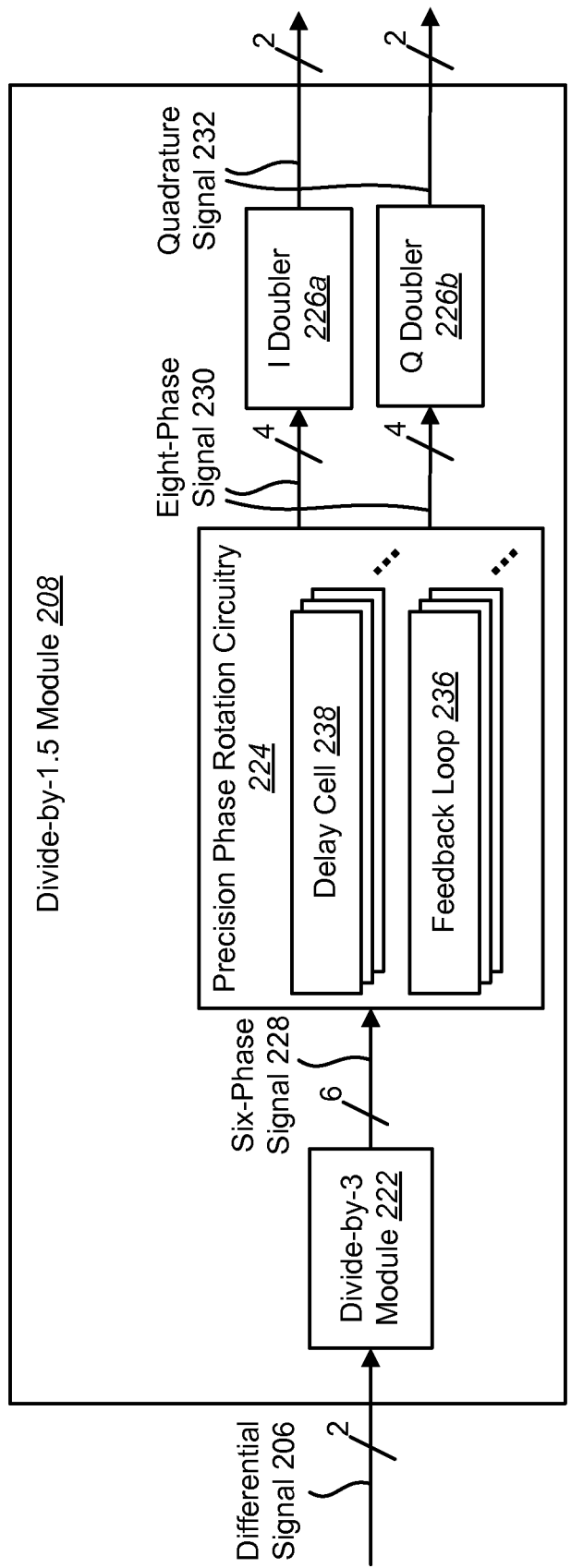
FIG. 2 is a block diagram of a divide-by-1.5 module.

FIG. 2 is a block diagram of a divide-by-1.5 module 208. The divide-by-1.5 module 208 may include a divide-by-3 module 222 followed by precision phase rotation circuitry 224, followed by one or more doublers 226a-b. The divide-by-3 module 222 may receive a differential signal 206, e.g., from a frequency synthesizer 104. The divide-by-3 module 222 may divide the frequency of the differential signal 206 and produce a six-phase signal 228 for the precision phase rotation circuitry 224. The precision phase rotation circuitry 224 may receive the six-phase signal 228 and produce an eight-phase signal 230. This may include using one or more delay cells 238 and one or more feedback loops 236. As used herein, the term "delay cell" 238 refers to any module that time delays a signal in the time domain or phase shifts a signal in the frequency domain. Four of the phases within the eight-phase signal 230 may be sent to an I (in-phase) doubler 226a and the other four phases may be sent to a Q (out-of-phase) doubler 226b. The combined outputs of the I doubler 226a and the Q doubler 226b may form a quadrature signal 232.

By using an architecture with a divider 222 followed by a doubler 226a-b (rather than a doubler followed by a divider), many of the problems associated with divide-by-1.5 modules 208 may be avoided. Specifically, by placing the divide-by-3 module 222 before the doubler 226a-b, the divide-by-3 module 222 is able to operate at a lower frequency, e.g., at a VCO frequency (Fvco), not twice VCO frequency (2*Fvco). This may enable more reliable divider 222 functionality. Additionally, the divide-by-1.5 module 208 may not include an RC/CR network (e.g., to split a single phase into multiple phases), which may result in lower current consumption. In one configuration, current consumption may be reduced by approximately 40% compared to a configuration with a doubler 226a-b followed by a divider 222. Additionally, the phase accuracy of the divide-by-1.5 module 208 may be process- and temperature-independent, which may improve residue sideband performance, e.g., by about 10 dB.

Figure 3:
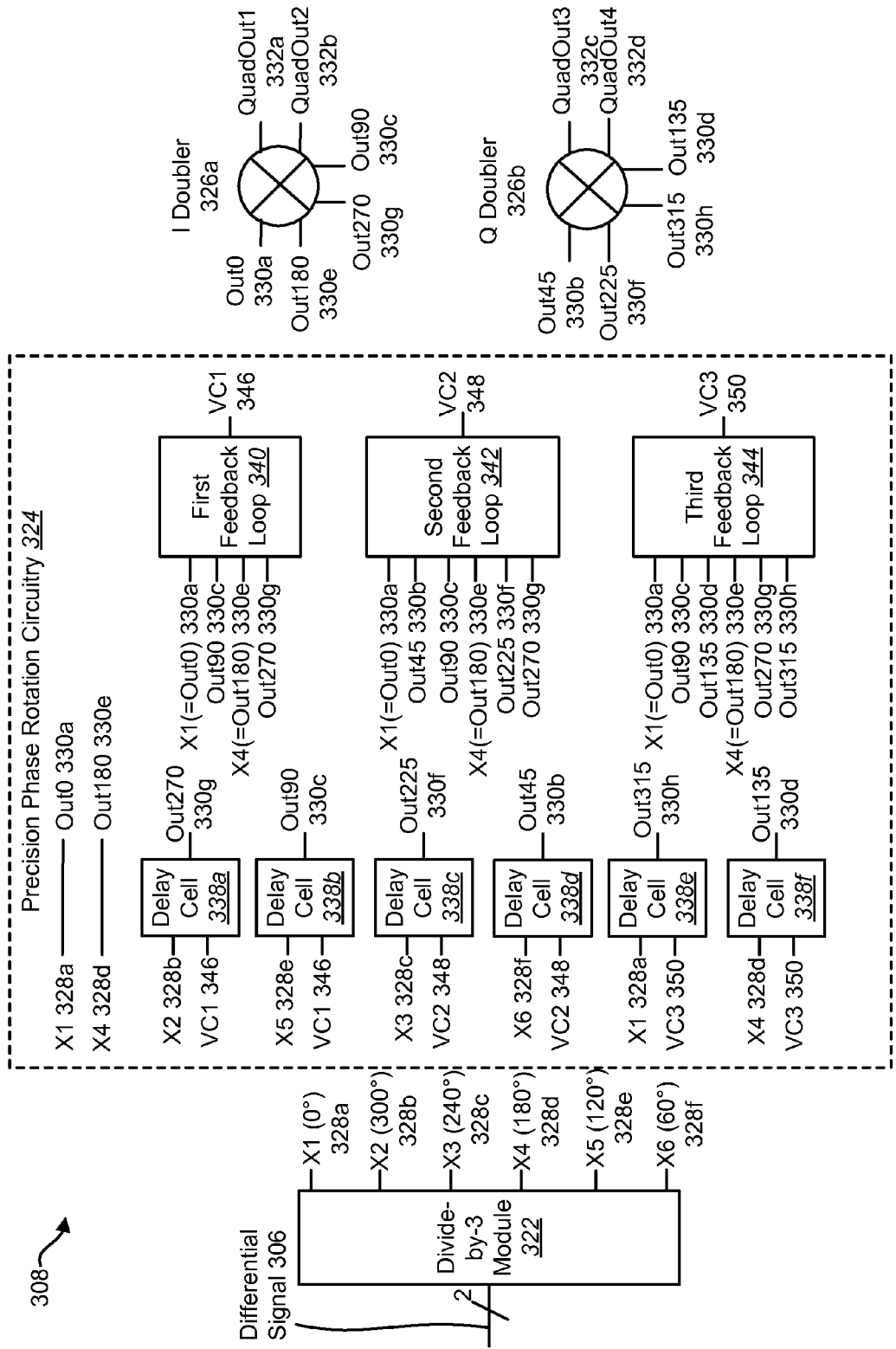
FIG. 3 is a block diagram illustrating a divide-by-1.5 module.

FIG. 3 is a block diagram illustrating a divide-by-1.5 module 308. As before, the divide-by-1.5 module 308 may include a divide-by-3 module 322, precision phase rotation circuitry 324 and one or more doublers 326a-b. The divide-by-3 module 322 may receive a differential signal 306 (i.e., two phases) at frequency Fvco and produce a six-phase signal (X1-X6) 328a-f at a frequency of Fvco/3. The precision phase rotation circuitry 324 may receive the six-phase signal (X1-X6) 328a-f and produce an eight-phase signal (Out0-Out315) 330a-h. Four of the phases within the eight-phase signal (Out0-Out315) 330a-h may be sent to an I (in-phase) doubler 326a and the other four phases may be sent to a Q (out-of-phase) doubler 326b. The combined outputs of the I doubler 326a and the Q doubler 326b may form a quadrature signal (QuadOut1-QuadOut4) 332a-d.

Specifically, the precision phase rotation circuitry 324 may use a combination of delay cells 338a-f and feedback loops 340, 342, 344 to turn the six-phase signal (X1-X6) 328a-f into the eight-phase signal (Out0-Out315) 330a-h. Each delay cell 338a-f may receive one phase from the six-phase signal (X1-X6) 328a-f and a control signal (i.e., VC1 346, VC2 348 or VC3 350) and produce one of the phases in the eight-phase signal (Out0-Out315) 330a-h. For example, a first delay cell 338a may receive X2 328b (from the six-phase signal 328) and VC1 346 (from the first feedback loop 340) and produce Out270 330g. Similarly, a second delay cell 338b may receive X5 328e (from the six-phase signal 328) and VC1 346 (from the first feedback loop 340) and produce Out90 330c. Similar processing paths are illustrated in the precision phase rotation circuitry 324 for the third delay cell 338c, fourth delay cell 338d, fifth delay cell 338e and sixth delay cell 338f to produce Out225 330f, Out45 330b, Out315 330h and Out135 330d, respectively.

Each feedback loop 340, 342, 344 may include a combination of AND gates, resistors, capacitors and operational amplifiers to adjust phases, i.e., to produce control signals (VC1-VC3) 346, 348, 350 used to control delay cells 338a-f to rotate phases in the six-phase signal (X1-X6) 328a-f to produce the eight-phase signal (Out0-Out315) 330a-h. In one configuration of the precision phase rotation circuitry 324, the feedback loops 340, 342, 344 may include similar circuit elements, but may differ in the inputs received, thus resulting in different outputs. For example, the first feedback loop 340 may receive Out0 330a (identical to X1 328a), Out90 330c, Out180 330e (identical to X4 328d) and Out270 330g to produce a first control signal (VC1) 346. The second feedback loop 342 may receive Out0 330a, Out45 330b, Out90 330c, Out180 330e Out225 330f and Out270 330g to produce a second control signal (VC2) 348. The third feedback loop may receive Out0 330a, Out90 330c, Out135 330d, Out180 330e, Out270 330g and Out315 330h, to produce a third control signal (VC3) 350. The control signals (VC1-VC3) 346, 348, 350 may determine how much delay is performed by a delay cell 338a-f. X1 328a and X4 328d may be considered equal to Out0 330a and Out180 330e, respectively, without any additional delay from a delay cell 338a-f.

The I (in-phase) doubler 326a and the Q (out-of-phase) doubler 326b may each receive four of the phases in the eight-phase signal (Out0-Out315) 330a-h to produce the quadrature signal 332 with a third frequency that is Fvco/1.5. Specifically, the I doubler 326a may receive Out0 330a, Out180 330e, Out90 330c and Out270 330g to produce two phases in the quadrature signal (QuadOut1-QuadOut2) 332a-b. Similarly, the Q doubler 326b may receive Out45 330b, Out225 330f, Out315 330h and Out135 330d to produce the other two phases in the quadrature signal (QuadOut3-QuadOut4) 332c-d.

Figure 4B:
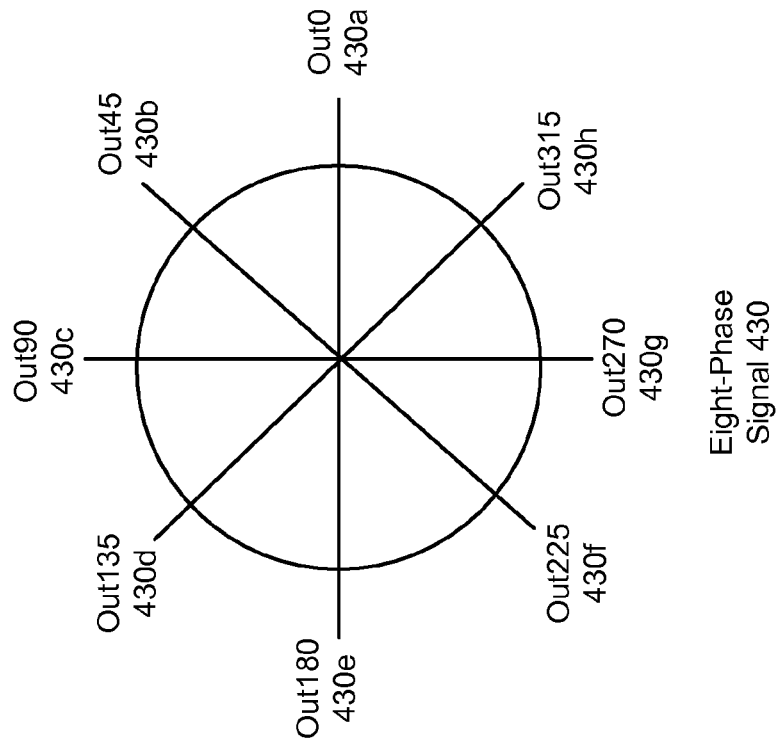
FIG. 4B is a phase diagram illustrating an eight-phase signal that is output from precision phase rotation circuitry.
Figure 4A:
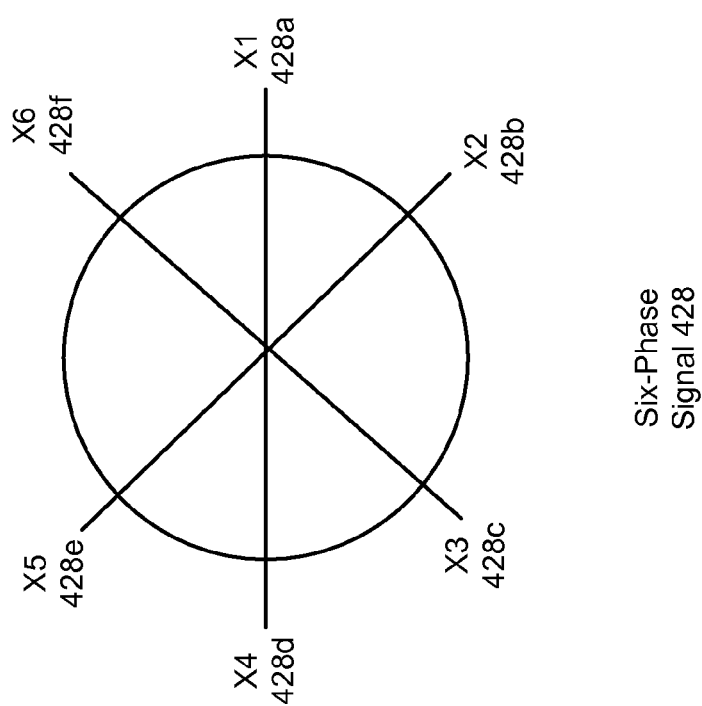
FIG. 4A is a phase diagram illustrating a six-phase signal (X1-X6) that is input to precision phase rotation circuitry.

FIG. 4A is a phase diagram illustrating a six-phase signal (X1-X6) 428a-f that is input to precision phase rotation circuitry 324. For example, the six phases (X1-X6) 428a-f may be output from a divide-by-3 module 322. As illustrated, the phases of the six-phase signal (X1-X6) 428a-f may be evenly spaced 60 degrees apart from each other. In other words, X1 428a, X6 428f, X5 428e, X4 428d, X3 428c and X2 428b may have phases of 0, 60, 120, 180, 240 and 300 degrees, respectively.

FIG. 4B is a phase diagram illustrating an eight-phase signal 430 that is output from precision phase rotation circuitry 324. For example, the eight phases (Out0-Out315) 430a-h may be input between an I (in-phase) doubler 326a and a Q (out-of-phase) doubler 326b to produce a quadrature signal (QuadOut1-QuadOut4) 332a-d. As illustrated, the phases of the eight-phase signal (Out0-Out315) 430a-h may be evenly spaced 45 degrees apart from each other. In other words, Out0 430a, Out45 430b, Out90 430c, Out135 430d, Out180 430e, Out225 430f, Out270 430g and Out315 430h may have phases of 0, 45, 90, 135, 180, 225, 270 and 315 degrees, respectively.

Figure 5:
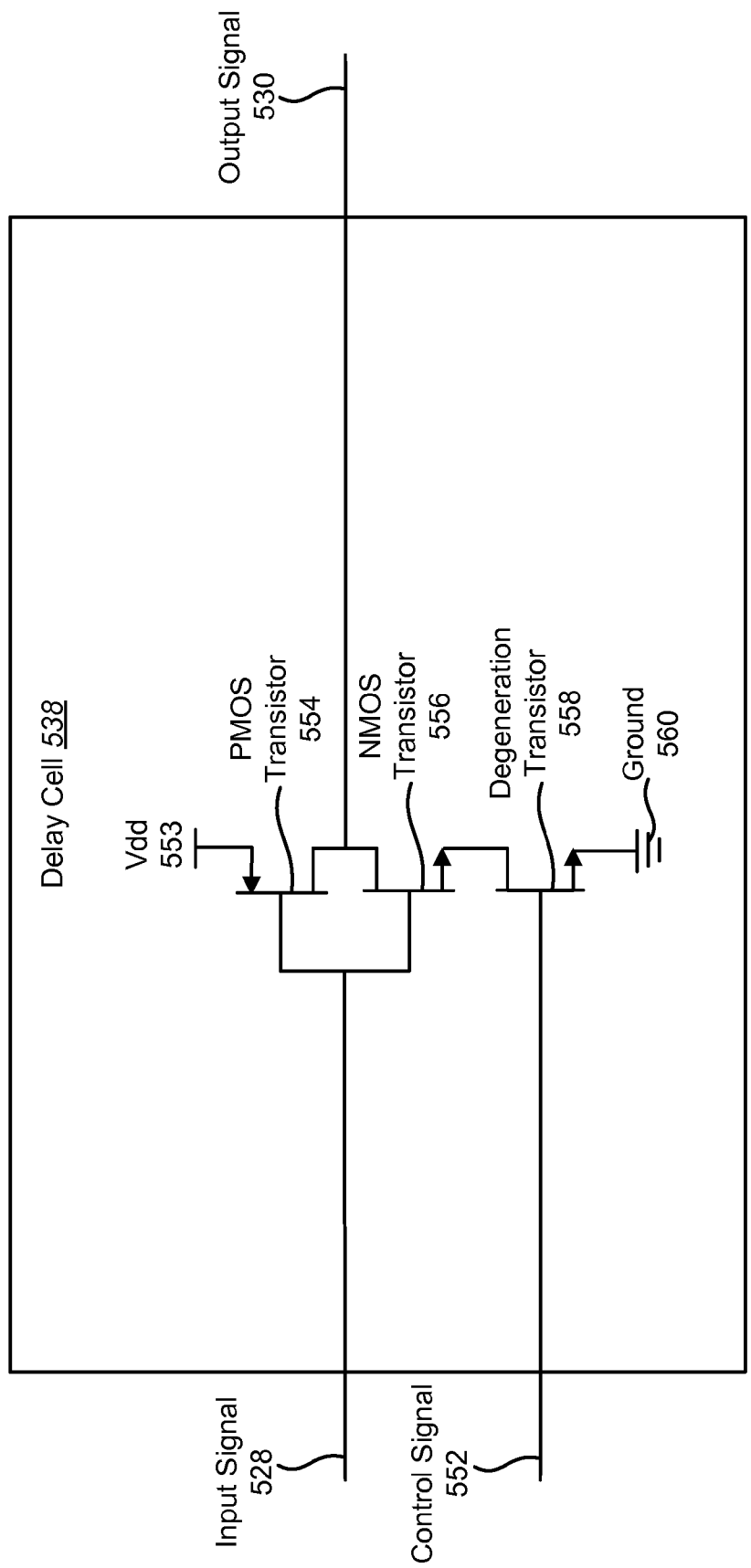
FIG. 5 is a circuit diagram illustrating a delay cell, e.g., used in precision phase rotation circuitry.

FIG. 5 is a circuit diagram illustrating a delay cell 538, e.g., used in precision phase rotation circuitry 324. The delay cell 538 may receive an input signal 528 (e.g., a portion of the six-phase signal (X1-X6) 328a-f) and a control signal 552 (e.g., from a feedback loop 340, 342, 344) and produce an output signal (e.g., a portion of an eight-phase signal (Out0-Out315) 330a-h. The input signal 528 may be fed to the gates of a p-channel metal oxide semiconductor (PMOS) transistor 554 and an n-channel metal oxide semiconductor (NMOS) transistor 556. The p-channel transistor 554 may be in a series configuration with the n-channel transistor 556.

A control signal 552 may be fed to the gate of a degeneration transistor 558, e.g., an n-channel degeneration transistor 558. In one configuration, the higher the voltage level of the control signal 552, the lower the delay produced at the output signal 530, i.e., maximum voltage on the control signal 552 may produce zero delay in the output signal 530. Conversely, the lower the voltage level of the control signal 552, the higher the delay produced at the output signal 530, i.e., a zero voltage on the control signal 552 may produce a maximum delay in the output signal 530. While a configuration with a degeneration transistor 558 is illustrated, any suitable configuration of a delay cell 538 may be used. For example, a switched capacitor bank may be used that provides variable delay based on a control signal 552. Furthermore, regardless of the configuration used, one or more delay cells 538 may be cascaded together to increase the possible delay.

In one configuration, the source of the PMOS transistor 554 may be coupled to a direct current (DC) reference voltage (Vdd) 553. The drains of the PMOS transistor 554 and the NMOS transistor 556 may be coupled together. The source of the NMOS transistor 556 may be coupled to the drain of the degeneration transistor 558. The source of the degeneration transistor 558 may be coupled to ground 560. Specifically, the control signal 552 may adjust the resistance of the degeneration transistor 558, thereby adjusting the overall delay of the delay cell 538. Furthermore, the dimensions of the degeneration transistor 558 may be selected for the particular application in which the present systems and methods are applied, e.g., a smaller degeneration transistor 558 may permit a larger resistance and affect the overall delay range of the delay cell 538.

Figure 6:
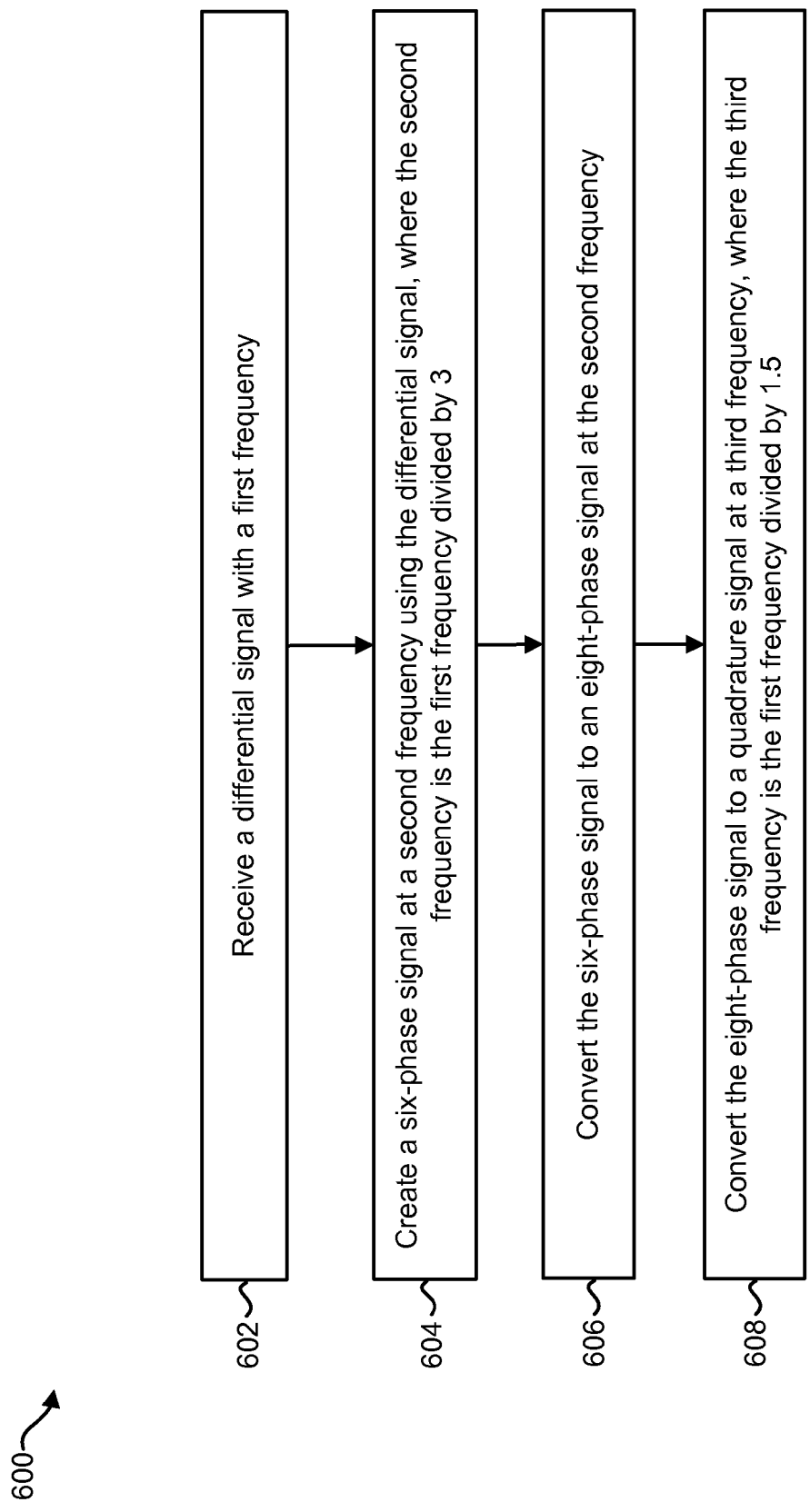
FIG. 6 is a flow diagram illustrating a method for dividing a frequency by 1.5 to produce a quadrature signal.

FIG. 6 is a flow diagram illustrating a method 600 for dividing a frequency by 1.5 to produce a quadrature signal 232. The method 600 may be performed by a divide-by-1.5 module 208. The divide-by-1.5 module 208 may receive 602 a differential signal 206 with a first frequency, e.g., a VCO frequency (Fvco). For example, the differential signal 206 may be received from a frequency synthesizer 104 in a receiver 102. The divide-by-1.5 module 208 may also create 604 a six-phase signal 228 at a second frequency, where the second frequency is the first frequency divided by 3, i.e., Fvco/3. The divide-by-1.5 module 208 may use a divide-by-3 module 222 to create the six-phase signal 228. The phases of the six-phase signal 228 may be evenly spaced 60 degrees apart from each other, i.e., the six-phase signal may have phases of 0, 60, 120, 180, 240 and 300 degrees.

The divide-by-1.5 module 208 may also convert 606 the six-phase signal 228 to an eight-phase signal 230 at the second frequency, i.e., Fvco/3. This may include using precision phase rotation circuitry 224. Specifically, this conversion may include using a combination of delay cells 238 and feedback loops 236 to create the eight-phase signal 230 from the six-phase signal 228. The divide-by-1.5 module 208 may also convert 608 the eight-phase signal 230 to a quadrature signal 232 at a third frequency that is the first frequency divided by 1.5 and the second frequency multiplied by 2. In other words, the third frequency may be Fvco/1.5. This may include using one or more doublers, e.g., an I (in-phase) doubler 226a and a Q (out-of-phase) doubler 226b.

Figure 7A:
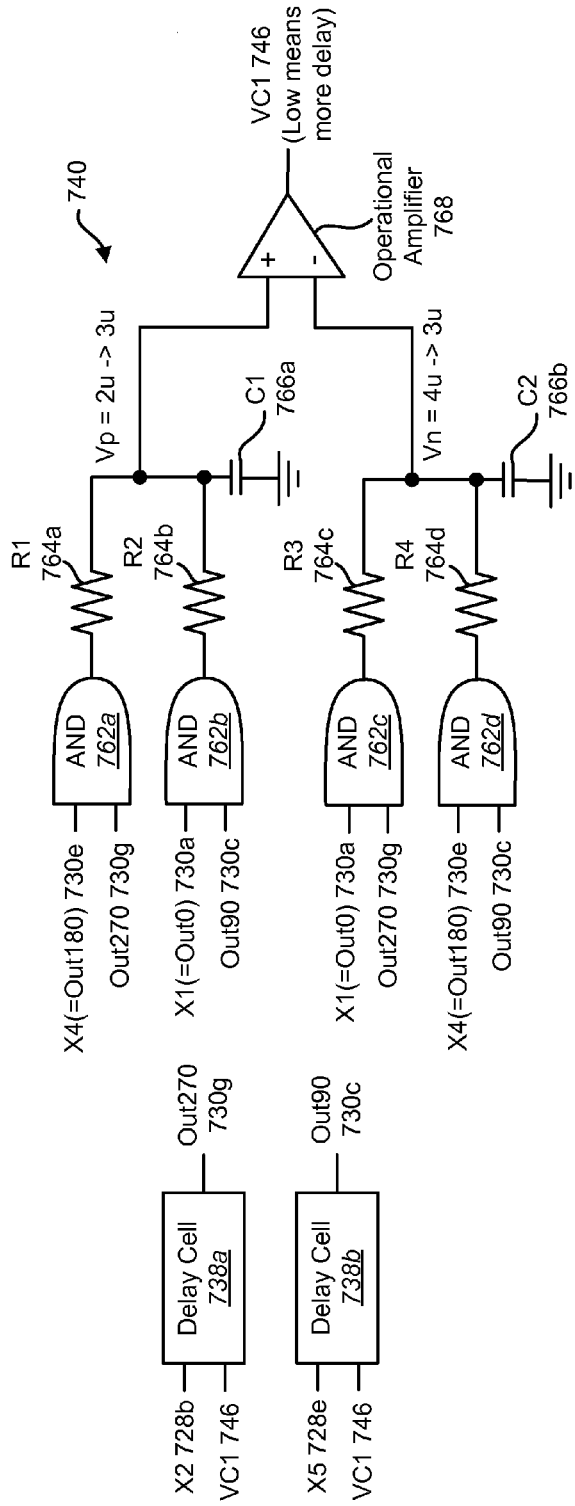
FIG. 7A is a circuit diagram illustrating operation of the first feedback loop.

FIG. 7A is a circuit diagram illustrating operation of the first feedback loop 740. The feedback loop 740 may use a variety of signals available in the phase rotation circuitry 324 to produce a first control signal (VC1) 746 that determines the amount of delay introduced by the delay cells 738a-b. In other words, the first control signal (VC1) 746 may be fed back to the input of the delay cells 738a-b to determine how much to delay X2 728b and X5 728e. Specifically, the first feedback loop 740 may receive Out0 730a (identical to X1 728a), Out90 730c, Out180 730e (identical to X4 728d) and Out270 730g to produce a first control signal (VC1) 746.

The feedback loop 740 may include four logical AND gates 762a-d, four resistors (R1-R4) 764a-d and two capacitors (C1-C2) 766a-b to provide two inputs to an operational amplifier 768. The first two AND gates 762a-b, first two resistors (R1-R2) 764a-b and first capacitor (C1) 766a may act as a first (or top) averaging circuit that provides an input to the positive input terminal of the operational amplifier 768. The last two AND gates 762c-d, last two resistors (R3-R4) 764c-d and second capacitor (C2) 766b may act as a second (or bottom) averaging circuit that provides an input to the negative input terminal of the operational amplifier 768. The resistors (R1-R4) 764a-d and capacitors (C1-C2) 766a-b may combine to low-pass filter the outputs of the AND gates 762a-d. Furthermore, the input voltage of the positive terminal will be referred to as Vp and the input voltage of the negative terminal will be referred to as Vn. Voltage will be discussed in relation to the feedback loop in terms of DC voltage units, where 1 u=1 DC voltage unit=Vdd/12.

To begin, assume VC1 746 is at a maximum, which causes no delay in the delay cells 738a-b. Without any delay, the output of the first delay cell may be at 300 degrees (the same as X2 728b) and the output of the second delay cell may be at 120 degrees (the same as X5 728e). The top averaging circuit may produce Vp=2 u and the bottom averaging circuit may produce Vn=4 u. The unequal inputs may force the operational amplifier 768 output (VC1) 746 low, which causes more delay. Equilibrium may be established when X2 728b and X5 728e are delayed such that Vp=Vn=3 u. Accordingly, X2 728b and X5 728e may be effectively delayed by 30 degrees (or 1 u) to become Out270 730g and Out90 730c, respectively.

Figure 7B:
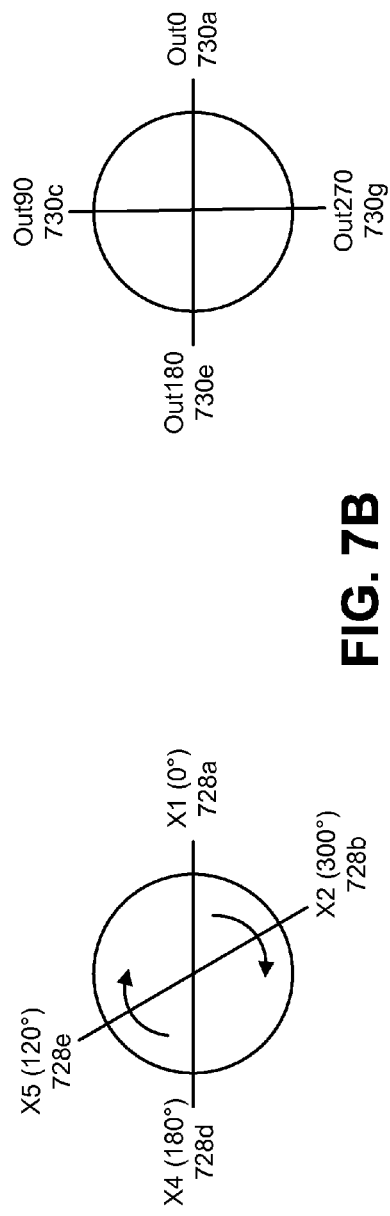
FIG. 7B is a graphical illustration of phase rotation caused by the first feedback loop and delay cells.

FIG. 7B is a graphical illustration of phase rotation caused by the first feedback loop 740 and delay cells 738a-b. On the left, X1 728a, X2 728b, X4 728d and X5 728e (inputs to the first feedback loop 740) are illustrated at 0, 300, 180 and 120 degrees, respectively. On the right, Out0 730a, Out90 730c, Out1 80 730e and Out270 730g are illustrated at 0, 90, 180 and 270 degrees, respectively. Therefore, using X1 728a and X4 728d as references, the delay cells 738a-b and first feedback loop 740 are able to rotate X2 728b and X5 728e thirty degrees clockwise.

FIG. 8A is a circuit diagram illustrating operation of the second feedback loop 842. The feedback loop 842 may use a variety of signals available in the phase rotation circuitry 324 to produce a second control signal (VC2) 848 that determines the amount of delay introduced by the delay cells 838c-d. In other words, the second control signal (VC2) 848 may be fed back to the input of the delay cells 838c-d to determine how much to delay X3 828c and X6 828f. The second feedback loop 842 may receive Out0 830a, Out45 830b, Out90 830c, Out180 830e Out225 830f and Out270 830g to produce a second control signal (VC2) 848.

The second feedback loop 842 illustrated in FIG. 8A may include similar functionality and circuit elements as the first feedback loop 740 illustrated in FIG. 7A. Specifically, the AND gates 862a-d, resistors (R1-R4) 864a-d, capacitors (C1-C2) 866a-b and operational amplifier 868 illustrated in FIG. 8A may correspond to the AND gates 762a-d, resistors (R1-R4) 764a-d, capacitors (C1-C2) 766a-b and operational amplifier 768 illustrated in FIG. 7A.

In contrast, however, the delay cells 838c-d and second feedback loop 842 may use X1 828a and X4 828d as references to rotate X3 828c and X6 828f 15 degrees clockwise (instead of rotate X2 728b and X5 728e 30 degrees as in FIG. 7A). To do this, the top averaging circuit may produce Vp=1 u and the bottom averaging circuit may produce Vn=2 u. The unequal inputs may force the operational amplifier 868 output (VC2) 848 low, which causes more delay. Equilibrium may be established when X3 828c and X6 828f are delayed such that Vp=Vn=1.5 u. Accordingly, X3 828c and X6 828f may be effectively delayed by 15 degrees to become Out225 830f and Out45 830b, respectively.

FIG. 8B is a graphical illustration of phase rotation caused by the second feedback loop 842 and delay cells 838c-d. On the left, X1 828a, X3 728c, X4 828d and X6 828f (inputs to the second feedback loop 842) are illustrated at 0, 240, 180 and 60 degrees, respectively. On the right, Out0 830a, Out45 830b, Out180 830e and Out225 830f are illustrated at 0, 45, 180 and 225 degrees, respectively. Therefore, using X1 828a and X4 828d as references, the delay cells 838c-d and second feedback loop 842 are able to rotate X3 828c and X6 828f fifteen degrees clockwise.

FIG. 9A is a circuit diagram illustrating operation of the third feedback loop 944. The feedback loop 944 may use a variety of signals available in the phase rotation circuitry 324 to produce a third control signal (VC3) 950 that determines the amount of delay introduced by the delay cells 938e-f. In other words, the third control signal (VC3) 950 may be fed back to the input of the delay cells 938e-f to determine how much to delay X1 928a and X4 928d. The third feedback loop may receive Out0 930a, Out90 930c, Out135 930d, Out180 930e, Out270 930g and Out315 930h, to produce a third control signal (VC3) 950.

The third feedback loop 944 illustrated in FIG. 9A may include similar functionality and circuit elements as the first feedback loop 740 illustrated in FIG. 7A. Specifically, the AND gates 962a-d, resistors (R1-R4) 964a-d, capacitors (C1-C2) 966a-b and operational amplifier 968 illustrated in FIG. 9A may correspond to the AND gates 762a-d, resistors (R1-R4) 764a-d, capacitors (C1-C2) 766a-b and operational amplifier 768 illustrated in FIG. 7A.

In contrast, however, the delay cells 938e-f and third feedback loop 944 may rotate X1 928a and X4 928d 45 degrees clockwise. To do this, the top averaging circuit may produce Vp=3 u and the bottom averaging circuit may produce Vn=0 u. Equilibrium may be established when X1 928a and X4 928d are delayed such that Vp=Vn=1.5 u. Accordingly, X1 928a and X4 928d may be effectively delayed by 45 degrees to become Out315 930h and Out135 930d, respectively.

FIG. 9B is a graphical illustration of phase rotation caused by the third feedback loop 944 and delay cells 938e-f. On the left, X1 928a and X4 928d are illustrated at 0 and 180 degrees, respectively. On the right, Out0 930a, Out135 930d, Out180 930e and Out315 930h are illustrated at 0, 135, 180 and 315 degrees, respectively. Therefore, X1 928a and X4 928d may be rotated 45 degrees clockwise using the delay cells 938e-f and third feedback loop 944.

Figure 10:
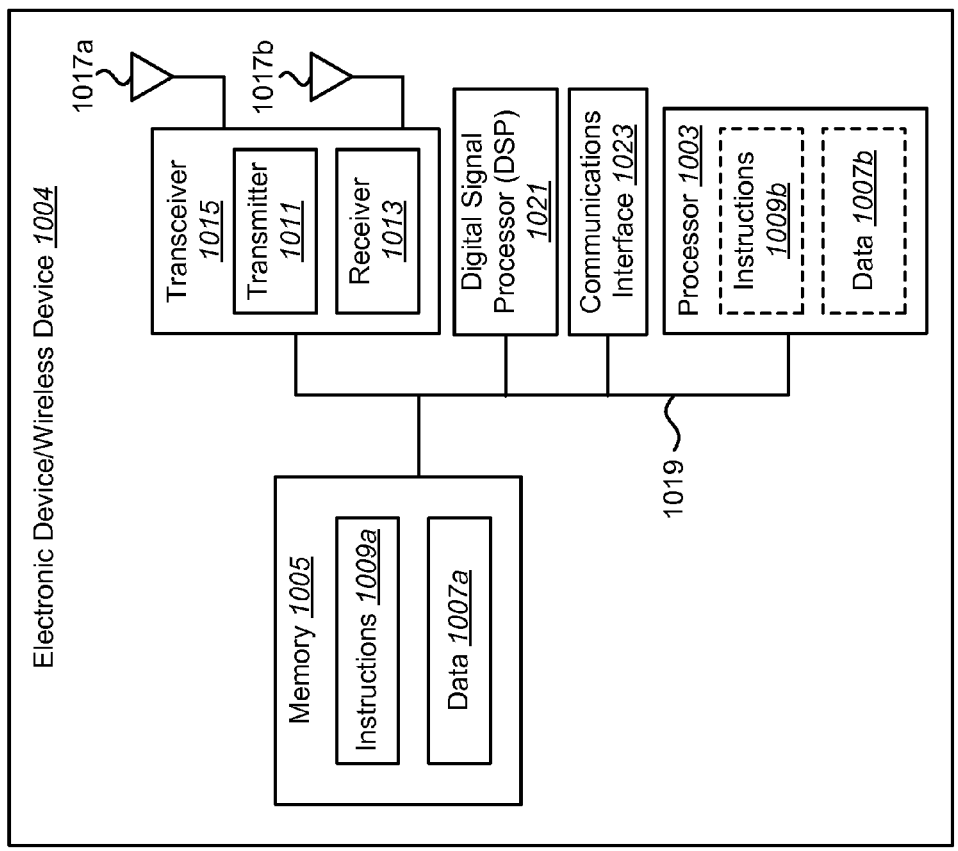
FIG. 10 illustrates certain components that may be included within an electronic device/wireless device.

FIG. 10 illustrates certain components that may be included within an electronic device/wireless device 1004. The electronic device/wireless device 1004 may be an access terminal, a mobile station, a user equipment (UE), a base station, an access point, a broadcast transmitter, a node B, an evolved node B, etc. The electronic device/wireless device 1004 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the electronic device/wireless device 1004 of FIG. 10, in an alternative configuration, a combination of processors (e.g., an ARM and DSP) could be used.

The electronic device/wireless device 1004 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007a and instructions 1009a may be stored in the memory 1005. The instructions 1009a may be executable by the processor 1003 to implement the methods disclosed herein. Executing the instructions 1009a may involve the use of the data 1007a that is stored in the memory 1005. When the processor 1003 executes the instructions 1009a, various portions of the instructions 1009b may be loaded onto the processor 1003, and various pieces of data 1007b may be loaded onto the processor 1003.

The electronic device/wireless device 1004 may also include a transmitter 1011 and a receiver 1013 to allow transmission and reception of signals to and from the electronic device/wireless device 1004. The transmitter 1011 and receiver 1013 may be collectively referred to as a transceiver 1015. Multiple antennas 1017a-b may be electrically coupled to the transceiver 1015. The electronic device/wireless device 1004 may also include (not shown) multiple transmitters, multiple receivers, multiple transceivers and/or additional antennas.

The electronic device/wireless device 1004 may include a digital signal processor (DSP) 1021. The electronic device/wireless device 1004 may also include a communications interface 1023. The communications interface 1023 may allow a user to interact with the electronic device/wireless device 1004.

The various components of the electronic device/wireless device 1004 may be coupled together by one or more buses, which may include a power bus, a control signal bus, a status signal bus, a data bus, etc. For the sake of clarity, the various buses are illustrated in FIG. 10 as a bus system 1019.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An apparatus for dividing a frequency by 1.5 to produce a quadrature signal, comprising:
    a divider that receives a differential input signal with a first frequency and two phases and creates a six-phase signal at a second frequency, wherein the second frequency is the first frequency divided by 3;
    precision phase rotation circuitry that receives the six-phase signal and produces an eight-phase signal, wherein the precision phase rotation circuitry comprises one or more delay cells that each rotate one or more phases in the six-phase signal; and
    a doubler that receives the eight-phase signal and produces a quadrature signal, wherein the quadrature signal has a third frequency that is the first frequency divided by 1.5.

2. The apparatus of claim 1, wherein each delay cell rotates one or more phases by 15 degrees, 30 degrees or 45 degrees.

3. The apparatus of claim 2, wherein an amount of phase rotation performed is based on a control signal to each delay cell.

4. The apparatus of claim 3, wherein the control signal is determined by a feedback loop, wherein a control signal with a high value produces less delay than a control signal with a low value.

5. The apparatus of claim 4, wherein each feedback loop comprises one or more logical AND gates, resistors and capacitors, wherein the resistors and capacitors operate as a low pass filter for output of the logical AND gates.

6. The apparatus of claim 1, wherein the phase rotation circuitry comprises six delay cells, each rotating a different phase in the six-phase signal.

7. The apparatus of claim 1, wherein each delay cell comprises a p-channel transistor, an n-channel transistor and an n-channel degeneration transistor in a series configuration, wherein a control signal received at a gate of the degeneration transistor determines an amount of delay for an input signal received at gates of the p-channel transistor and the n-channel transistor.

8. The apparatus of claim 7, wherein drains of the p-channel transistor and n-channel transistor are coupled at an output of the delay cell, wherein a source of the n-channel transistor is coupled to a drain of the degeneration transistor, wherein a source of the degeneration transistor is coupled to ground, wherein a source of the p-channel transistor is coupled to a direct current reference voltage.

9. A method for dividing a frequency by 1.5 to produce a quadrature signal, comprising:
    receiving a differential signal with a first frequency;
    creating a six-phase signal at a second frequency based on the differential signal, wherein the second frequency is the first frequency divided by 3;
    converting the six-phase signal to an eight-phase signal at the second frequency, wherein the converting the six-phase signal to an eight-phase signal comprises using precision phase rotation circuitry comprising one or more delay cells that each rotate one or more phases in the six-phase signal; and
    converting the eight-phase signal to a quadrature signal at a third frequency, wherein the third frequency is the first frequency divided by 1.5.

10. The method of claim 9, wherein each delay cell rotates one or more phases by 15 degrees, 30 degrees or 45 degrees.

11. The method of claim 10, wherein an amount of phase rotation performed is based on a control signal to each delay cell.

12. The method of claim 11, further comprising determining control signals for each delay cell, by one or more feedback loops, wherein a control signal with a high value produces less delay than a control signal with a low value.

13. The method of claim 12, wherein each feedback loop comprises one or more logical AND gates, resistors and capacitors, wherein the resistors and capacitors operate as a low pass filter for output of the logical AND gates.

14. The method of claim 9, wherein the phase rotation circuitry comprises six delay cells, each rotating a different phase in the six-phase signal.

15. The method of claim 9, wherein each delay cell comprises a p-channel transistor, an n-channel transistor and an n-channel degeneration transistor in a series configuration, wherein a control signal received at a gate of the degeneration transistor determines an amount of delay for an input signal received at gates of the p-channel transistor and the n-channel transistor.

16. The method of claim 15, wherein drains of the p-channel transistor and n-channel transistor are coupled at an output of the delay cell, wherein a source of the n-channel transistor is coupled to a drain of the degeneration transistor, wherein a source of the degeneration transistor is coupled to ground, wherein a source of the p-channel transistor is coupled to a direct current reference voltage.

17. An apparatus for dividing a frequency by 1.5 to produce a quadrature signal, comprising:
    means for receiving a differential signal with a first frequency;
    means for creating a six-phase signal at a second frequency based on the differential signal, wherein the second frequency is the first frequency divided by 3;

means for converting the six-phase signal to an eight-phase signal at the second frequency, wherein the means for converting the six-phase signal to an eight-phase signal comprises one or more means for delaying that each rotate one or more phases in the six-phase signal; and means for converting the eight-phase signal to a quadrature signal at a third frequency, wherein the third frequency is the first frequency divided by 1.5.

18. The apparatus of claim 17, wherein each means for delaying rotates one or more phases by 15 degrees, 30 degrees or 45 degrees.

19. The apparatus of claim 18, wherein an amount of phase rotation performed is based on a control signal to each means for delaying.

20. The apparatus of claim 19, further comprising one or more means for determining control signals for each means for delaying, wherein a control signal with a high value produces less delay than a control signal with a low value.

21. The apparatus of claim 20, wherein each means for determining comprises one or more logical AND gates, resistors and capacitors, wherein the resistors and capacitors operate as a low pass filter for output of the logical AND gates.

22. The apparatus of claim 17, wherein the means for converting comprises six delay cells, each rotating a different phase in the six-phase signal.

23. The apparatus of claim 17, wherein each means for delaying comprises a p-channel transistor, an n-channel transistor and an n-channel degeneration transistor in a series configuration, wherein a control signal received at a gate of the degeneration transistor determines an amount of delay for an input signal received at gates of the p-channel transistor and the n-channel transistor.

24. The apparatus of claim 23, wherein drains of the p-channel transistor and n-channel transistor are coupled at an output of the means for delaying, wherein a source of the n-channel transistor is coupled to a drain of the degeneration transistor, wherein a source of the degeneration transistor is coupled to ground, wherein a source of the p-channel transistor is coupled to a direct current reference voltage.

25. A computer-program product for dividing a frequency by 1.5 to produce a quadrature signal, the computer-program product comprising a non-transitory computer-readable medium having instructions thereon, the instructions, comprising:

code for receiving a differential signal with a first frequency;

code for creating a six-phase signal at a second frequency based on the differential signal, wherein the second frequency is the first frequency divided by 3;

code for converting the six-phase signal to an eight-phase signal at the second frequency, wherein the code for converting the six-phase signal to an eight-phase signal comprises code for delaying that rotates one or more phases in the six-phase signal; and code for converting the eight-phase signal to a quadrature signal at a third frequency, wherein the third frequency is the first frequency divided by 1.5.

26. The computer-program product of claim 25, wherein the code for delaying rotates one or more phases by 15 degrees, 30 degrees or 45 degrees.

* * * * *